(12) United States Patent
Nazarian et al.

(10) Patent No.: US 9,355,717 B1
(45) Date of Patent: May 31, 2016

(54) MEMORY ARRAY WITH EMBEDDED SOURCE LINE DRIVER AND IMPROVED VOLTAGE REGULARITY

(71) Applicant: Crossbar, Inc., Santa Clara, CA (US)

(72) Inventors: Hagop Nazarian, San Jose, CA (US); Sang Nguyen, Sunnyvale, CA (US)

(73) Assignee: Crossbar, Inc., Santa Clara, CA (US)

( * ) Notice: Subject to any disclaimer, the term of this patent is extended or adjusted under 35 U.S.C. 154(b) by 0 days.

(21) Appl. No.: 14/469,746

(22) Filed: Aug. 27, 2014

(51) Int. Cl.
*G11C 11/00* (2006.01)
*G11C 13/00* (2006.01)
*H01L 45/00* (2006.01)

(52) U.S. Cl.
CPC ........ *G11C 13/0021* (2013.01); *H01L 45/1608* (2013.01)

(58) Field of Classification Search
CPC ........... G11C 11/5642; G11C 16/3418; G11C 16/0483; G11C 16/26; G11C 29/00; G11C 11/5628; G11C 16/3427; G11C 16/3459; G11C 16/28; G11C 16/3454; G11C 16/3481
USPC ............. 365/185.17, 185.18, 185.21, 185.22, 365/185.02, 189.05, 222, 185.24
See application file for complete search history.

(56) References Cited

U.S. PATENT DOCUMENTS

2014/0347918 A1* 11/2014 Lee ................... G11C 11/1675
365/158

* cited by examiner

*Primary Examiner* — Thong Q Le
(74) *Attorney, Agent, or Firm* — Amin, Turocy & Watson, LLP

(57) ABSTRACT

Providing a memory array having an embedded source line driver is described herein. By way of example, the source line driver can comprise a dissipation line and a switching component that connects or disconnects the dissipation line with a source line of the memory array. When the switching component is activated, the dissipation line can provide a low resistance path from the source line to ground, as one example. Disclosed are circuits in which one or more dissipation lines are situated along a length of the source line, facilitating reduced variation in electrical characteristics (e.g., voltage drop) along the source line, improving regularity of memory operations for memory cells associated with the source line.

20 Claims, 10 Drawing Sheets

EXAMPLE OPERATIONAL METHODS
600

| | SELECTED BITLINE(S) | UNSELECTED BITLINE(S) | SOURCE LINE | DISSIPATION LINE |
|---|---|---|---|---|
| READ OPERATION 602 | READ VOLTAGE (E.G., 1 VOLT, ...) | 0 VOLTS | 0 VOLTS | 0 VOLTS |
| | READ VOLTAGE (E.G., 1 VOLT, ...) | FLOAT | 0 VOLTS | 0 VOLTS |
| PROGRAM OPERATION 604 | PROGRAM VOLTAGE (E.G., 2 VOLTS, ...) | 0 VOLTS | 0 VOLTS | 0 VOLTS |
| | PROGRAM VOLTAGE (E.G., 2 VOLTS, ...) | FLOAT | 0 VOLTS | 0 VOLTS |
| ERASE OPERATION 606 | 0 VOLTS | 0 VOLTS | ERASE VOLTAGE (E.G., 2 VOLTS, ...) | ERASE VOLTAGE (E.G., 2 VOLTS, ...) |
| | 0 VOLTS | FLOAT | ERASE VOLTAGE (E.G., 2 VOLTS, ...) | ERASE VOLTAGE (E.G., 2 VOLTS, ...) |

FIG. 6

MEMORY ARRAY WITH EMBEDDED SOURCE LINE DRIVER AND IMPROVED VOLTAGE REGULARITY

TECHNICAL FIELD

This disclosure relates generally to electronic memory, for example, the disclosure describes a memory array having an embedded source line driver configured to mitigate voltage variation along a source line of the memory array.

BACKGROUND

A recent innovation within the field of integrated circuit technology is resistive memory. While much of resistive memory technology is in the development stage, various technological concepts for resistive memory have been demonstrated by the assignee of the present invention and are in one or more stages of verification to prove or disprove associated theory(ies). Even so, resistive memory technology promises to hold substantial advantages over competing technologies in the semiconductor electronics industry.

Resistive random access memory (RRAM) is one example of resistive memory. The inventors of the present disclosure believe RRAM has the potential to be a high density non-volatile information storage technology. Generally, RRAM stores information by controllably switching among distinct resistive states. A single resistive memory can store a single bit of information, or multiple bits, and can be configured as a one-time programmable cell, or a programmable and erasable device, as various memory models demonstrated by the assignee provide.

Various theories have been proposed by the inventors to explain the phenomenon of resistive switching. In one such theory, resistance switching is a result of formation of a conductive structure within an otherwise electrically insulating medium. The conductive structure could be formed from ions, atoms that can be ionized under appropriate circumstances (e.g., a suitable electric field), or other charge carrying mechanisms. In other such theories, field-assisted diffusion of atoms can occur in response to a suitable electric potential applied to a resistive memory cell. In still other theories proposed by the inventors, formation of the conductive filament can occur in response to joule heating and electrochemical processes in binary oxides (e.g., NiO, $TiO_2$, or the like), or by a redox process for ionic conductors including oxides, chalcogenides, polymers, and so on.

The inventors expect resistive devices based on an electrode, insulator, electrode model to exhibit good endurance and life cycle. Further, the inventors expect such devices to have high on-chip densities. Accordingly, resistive elements may be viable alternatives to metal-oxide semiconductor (MOS) transistors employed for digital information storage. The inventors of the subject patent application, for instance, believe that models of resistive-switching memory devices provide some potential technical advantages over non-volatile Flash MOS devices.

In light of the above, the inventors endeavor to make further improvements in memory technology, and resistive memory.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

In various embodiments of the present disclosure, a memory array is provided having improved regularity in electrical characteristics of metal conductors. The improved regularity can maintain validity of electrical models for longer conductors, resulting in larger block sizes, and larger page sizes. This in turn can lead to improved memory density of such a memory array.

According to additional embodiments, a memory array is provided having an embedded source line driver. The source line driver can comprise a dissipation line and a switching component. When the switching component is activated, the dissipation line can provide a low resistance path from the source line to ground, as one example. When positioned strategically along a length of the source line, this dissipation line can reduce variation in electrical characteristics (e.g., voltage drop) along the source line, improving regularity of memory operations for memory cells associated with the source line.

In at least one embodiment, the subject disclosure provides a one transistor-one resistive (1T-1R) memory array. The 1T-1R memory array can be arranged in a logical NAND architecture, though the subject disclosure is not limited to such an arrangement. Further, the 1T-1R memory array can comprise a plurality of dissipation lines embedded between subsets of bitlines or wordlines of the memory array. The dissipation lines can be connected to a voltage source, or ground, and can be configured to mitigate variation in voltage dropped along source lines associated with the memory array. In some embodiments, respective dissipation lines can be spaced between an integer number of the bitlines or wordlines, allowing page or block size of the memory array to be expanded while mitigating irregularity in electrical characteristics of the source lines as a result of larger page or block size. This in turn can lead to larger memory densities, while mitigating at least some adverse effects associated with longer conductors.

In a further embodiment(s), the subject disclosure provides a memory device. The memory device can comprise an array of memory cells, each respective memory cell of the array comprising a transistor and a resistive switching device. Further, the memory device can comprise a set of bitlines comprising a bitline that is connected to first terminals of a first subset of the memory cells of the array and a set of wordlines comprising a wordline that is connected to transistor gate terminals of a second subset of the memory cells of the array. In addition to the foregoing, the memory device can comprise a source line connected to second terminals of the second subset of the memory cells of the array. Further still, the memory device can comprise a dissipation line situated between two bitlines of the set of bitlines, wherein the dissipation line interconnects a variable voltage source, or ground, to a first terminal of a switching component, and the source line is connected to a second terminal of the switching component.

In one or more other embodiments, there is provided a method of fabricating a memory device. The method can comprise forming a bitline in or on a substrate, forming a wordline in or on the substrate, forming a dissipation line in or on the substrate and forming a source line in or on the substrate. Additionally, the method can comprise forming an array of memory cells having respective first memory terminals and respective second memory terminals, respective memory cells of the array comprising a transistor in series with a resistive memory component. The method can further comprise connecting respective first terminals of a first subset of the array of memory cells to the bitline and connecting respective second terminals of a second subset of the array of memory cells to the source line. In one or more additional embodiments, the method can comprise forming a switch interconnecting the source line and the dissipation line, the switch configured to provide a low resistance path between the source line and the dissipation line in response to activation of the switch.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure;

FIG. 6 depicts a diagram of example methods for operating a memory device according to various disclosed embodiments.

DETAILED DESCRIPTION

Figure 1:
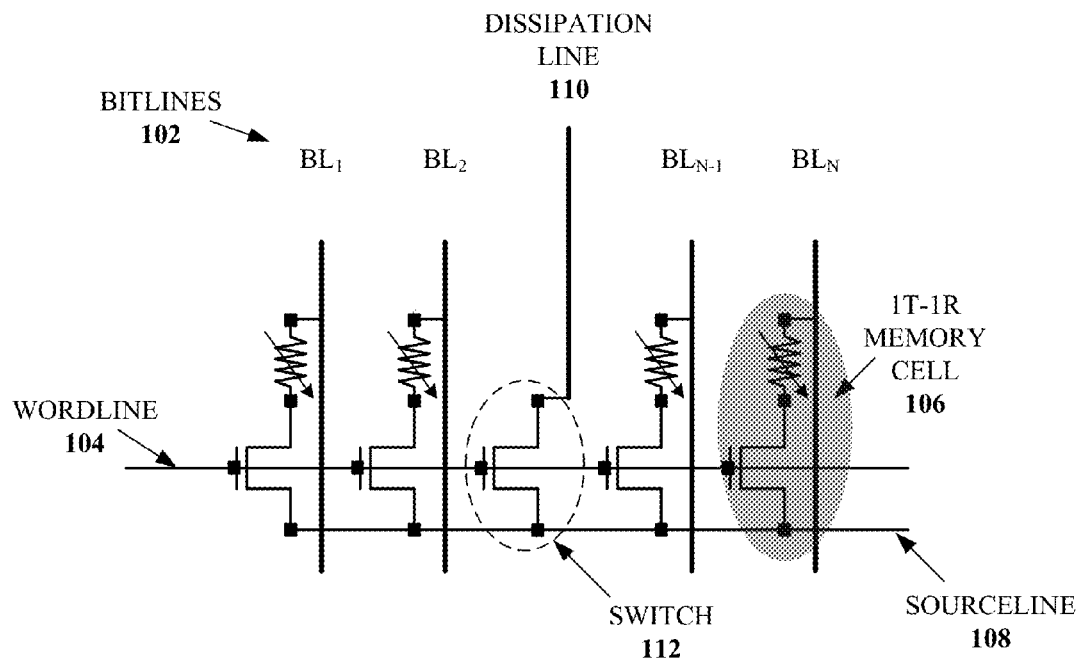
FIG. 1 illustrates a circuit diagram of an example memory array circuit comprising a dissipation line for improved regularity of the array, in some embodiments.

This disclosure relates to two-terminal memory cells employed for digital information storage. In some embodiments, the two-terminal memory cells can include a resistive technology, such as a resistive-switching two-terminal memory cell. Resistive-switching two-terminal memory cells (also referred to as resistive-switching memory cells or resistive-switching memory), as utilized herein, comprise circuit components having conductive contacts with an active region between the two conductive contacts. The active region of the two-terminal memory device, in the context of resistive-switching memory, exhibits a plurality of stable or semi-stable resistive states, each resistive state having a distinct electrical resistance. Moreover, respective ones of the plurality of states can be formed or activated in response to a suitable electrical signal applied at the two conductive contacts. The suitable electrical signal can be a voltage value, a current value, a voltage or current polarity, or the like, or a suitable combination thereof. An example of a resistive switching two-terminal memory device, though not exhaustive, can include a resistive random access memory (RRAM).

Embodiments of the subject disclosure can provide a filamentary-based memory cell. One example of a filamentary-based memory cell can comprise: a conductive, e.g. doped p-type (or n-type) silicon (Si) bearing layer (e.g., p-type or n-type polysilicon, p-type or n-type polycrystalline SiGe, etc.), a resistive switching layer (RSL) and an active metal layer capable of being ionized. Under suitable conditions, the active metal layer can provide filament forming ions to the RSL.

In various embodiments of the present disclosure, a p-type or n-type Si bearing layer can include a p-type or n-type polysilicon, p-type or n-type SiGe, or the like. A RSL (which can also be referred to in the art as a resistive switching media (RSM)) can comprise, e.g., an undoped amorphous Si layer, a semiconductor layer having intrinsic characteristics, a Si sub-oxide (e.g., SiOx wherein x has a value between 0.1 and 2), metallic oxide (e.g. Zinc Oxide) and so forth. Other examples of materials suitable for the RSL could include $Si_XGe_YO_Z$ (where X, Y and Z are respective suitable positive integers), a silicon oxide (e.g., $SiO_N$, where N is a suitable positive integer), amorphous Si (a-Si), amorphous SiGe (a-SiGe), $TaO_B$ (where B is a suitable positive integer), $HfO_C$ (where C is a suitable positive integer), $TiO_D$ (where D is a suitable positive integer), and so forth, or a suitable combination thereof.

An active metal layer for a filamentary-based memory cell can include, among others: silver (Ag), gold (Au), titanium (Ti), titanium-nitride (TiN) or other suitable compounds of titanium, nickel (Ni), copper (Cu), aluminum (Al), chromium (Cr), tantalum (Ta), iron (Fe), manganese (Mn), tungsten (W), vanadium (V), cobalt (Co), platinum (Pt), and palladium (Pd). Other suitable conductive materials, as well as compounds or combinations of the foregoing or similar materials can be employed for the active metal layer in some aspects of the subject disclosure. Some details pertaining to embodiments of the subject disclosure similar to the foregoing example(s) can be found in the following U.S. patent applications that are licensed to the assignee of the present application for patent: application Ser. No. 11/875,541 filed Oct. 19, 2007 and application Ser. No. 12/575,921 filed Oct. 8, 2009, each of which are incorporated by reference herein in their respective entireties and for all purposes.

To program a filamentary-based resistive switching memory cell, a suitable program voltage can be applied across the memory cell causing a conductive path or a filament to form through a relatively high resistive portion of the memory cell. This causes the memory cell to switch from a relatively high resistive state, to a relatively low resistive state. In some resistive-switching devices, an erase process can be implemented to deform the conductive filament, at least in part, causing the memory cell to return to the high resistive state from the low resistive state. This change of state, in the context of memory, can be associated with respective states of a binary bit. For an array of multiple memory cells, a word(s), byte(s), page(s), block(s), etc., of memory cells can be programmed or erased to represent zeroes or ones of binary information, and by retaining those states over time in effect storing the binary information In various embodiments, multi-level information (e.g., multiple bits) may be stored in such memory cells.

It should be appreciated that various embodiments herein may utilize a variety of memory cell technologies, having different physical properties. For instance, different resistive-switching memory cell technologies can have different discrete programmable resistances, different associated program/erase voltages, as well as other differentiating characteristics. For instance, various embodiments of the subject disclosure can employ a bipolar switching device that exhibits a first switching response (e.g., programming to one of a set of program states) to an electrical signal of a first polarity and a second switching response (e.g., erasing to an erase state) to the electrical signal having a second polarity. The bipolar switching device is contrasted, for instance, with a unipolar device that exhibits both the first switching response (e.g., programming) and the second switching response (e.g., erasing) in response to electrical signals having the same polarity and different magnitudes.

Where no specific memory cell technology or program/erase voltage is specified for the various aspects and embodiments herein, it is intended that such aspects and embodiments incorporate any suitable memory cell technology and be operated by program/erase voltages appropriate to that technology, as would be known by one of ordinary skill in the art or made known to one of ordinary skill by way of the context provided herein. It should be appreciated further that where substituting a different memory cell technology would require circuit modifications that would be known to one of ordinary skill in the art, or changes to operating signal levels that would be known to one of such skill, embodiments comprising the substituted memory cell technology(ies) or signal level changes are considered within the scope of the subject disclosure.

The inventors of the subject application are familiar with additional non-volatile, two-terminal memory structures in addition to resistive memory. For example, ferroelectric random access memory (RAM) is one example. Some others include magneto-resistive RAM, organic RAM, phase change RAM and conductive bridging RAM, and so on. Two-terminal memory technologies have differing advantages and disadvantages, and trade-offs between advantages and disadvantages are common. Though resistive-switching memory technology is referred to with many of the embodiments disclosed herein, other two-terminal memory technologies can be utilized for some of the disclosed embodiments, where suitable to one of ordinary skill in the art.

The inventors expect that—in addition to technological challenges inherent to two-terminal switching devices themselves—organizing multiple such devices (e.g., resistive switching memory cells) into an array will pose additional technological challenges. For instance, an array of switching devices can be created to provide high density switching components to serve as memory, logic gates, or other digital functions. But the inventors believe that as components of an array increase in size, electrical characteristics of such components can complicate or void electrical models of an associated electronic system. For instance, electrical characteristics of metal conductors—such as capacitance, resistance, and the like—can impact memory operations for cells having a predetermined voltage, capacitance, resistance, etc., associated with a particular state, or function. This irregularity can be exacerbated by length or size of a metal conductor, resulting in an indirect limitation on conductor size to maintain valid memory models. This limitation on conductor size can also limit page and block size of a memory, lowering overall memory density.

In various embodiments of the present disclosure, an array of two-terminal memory is provided that is configured to mitigate effects of disparate electrical characteristics throughout the array. For instance, the array can mitigate disparate localized voltages, capacitances, resistances, etc., of large components of the array in various disclosed embodiments. According to this example, respective subsets of the two-terminal memory can observe more uniform electrical characteristics from components of the array, facilitating more uniform operation. This in turn can allow larger page-size, block size, and so on, facilitating higher memory densities and reliable operational characteristics.

Referring now to the drawings, FIG. 1 illustrates a circuit diagram of an example memory circuit 100 according to one or more embodiments of the present disclosure. Memory circuit 100 can facilitate reduced disparity of electrical characteristics for components of memory circuit 100, in various embodiments. Accordingly, memory circuit 100 can be configured to provide improved regularity and reliability of memory operations among respective subsets of memory cells of memory circuit 100.

Memory circuit 100 can be configured as a one transistor-one resistor array (1T1R array), where respective 1T1R memory cells 106 comprise a transistor in series with a two-terminal switching device. In an embodiment(s), the transistor can comprise a three-terminal transistor having a gate node, a source node and a drain node (or suitable variations or equivalents thereof). Gate nodes of transistors can be connected to a wordline 104. Depending on a type or configuration of the transistors, suitable signals applied at wordline 104 (e.g., activation signal, deactivation signal, no signal, etc.) can be utilized to electrically control the transistors, as is known in the art or made known to one of ordinary skill in the art by way of the context provided herein.

In addition to the foregoing, memory circuit 100 can comprise a source line 106 and a set of bitlines 102. Source line 108 can be connected to respective source nodes, or respective drain nodes, in alternative embodiments, of respective transistors of 1T1R memory cells 106. Set of bitlines 102 can comprise bitlines $BL_1$, $BL_2$, ... $BL_{N-1}$, $BL_N$, where N is a suitable positive integer greater than one. Respective bitlines of set of bitlines 102 can be connected to respective ones of 1T1R memory cells 106. For instance, respective ones of set of bitlines 102 can be connected to respective first terminals of respective two-terminal switching devices of 1T1R memory cells 106. In this manner, set of bitlines 102 can be utilized to provide individual signals to respective ones of 1T1R memory cells 106, in conjunction with a common node at source line 108. As one example, a program signal can be applied to one of the 1T1R memory cells 106, while a different signal (or respective different signals) can be applied to other ones of the 1T1R memory cells 106. This can be achieved by applying the program signal to $BL_N$, and one or more other signals to bitlines $BL_1$, $BL_2$, ... $BL_{N-1}$ that are different from the program signal. In this case, zero volts, ground, or a suitable non-zero voltage (e.g., different from the program voltage) could be applied at source line 108, to facilitate application of different target voltage drops across respective ones of 1T1R memory cells 106, a common target voltage drop across a subset of 1T1R memory cells 106, the same voltage across 1T1R memory cells 106, or a suitable variation of the foregoing.

As described above, set of bitlines 102 and source line 108 can facilitate providing independent electric signals to respective 1T1R memory cells 106 of memory circuit 100. However, as part of a large array utilized for modern electronic memory systems, memory circuit 100 can have components with different localized electrical characteristics that affect subsets of 1T1R memory cells 106 differently. For instance, source line 108 can have different resistance values (e.g., with respect to a voltage driver node, not depicted, but see FIG. 5, infra) at different points along a length of source line 108. As a particular example, resistance of source line 108 at an intersection of $BL_N$ can be different from a resistance of source line 108 at an intersection of $BL_1$. The variance in resistance along the length of source line 108 can lead to different voltage drop values at respective intersections of source line 108 and respective ones of set of bitlines 102. As an illustrative example, a voltage drop at the intersection of $BL_N$ and source line 108 might be 0.1 volts, whereas a second voltage drop at the intersection of $BL_1$ and source line 108 can be about 0.9 volts, for instance. As a result, a single voltage (e.g., 1 volt, 3 volts, etc.) applied to $BL_N$ and $BL_1$ can result in about a 0.8 difference in potential across respective memory cells at $BL_N$ and $BL_1$. As a more particular example, based on the foregoing disparate voltages along the length of source line 108, 3 volts applied to $BL_1$ and $BL_N$ could result in a potential of 2.9 volts across the memory cell on $BL_N$, and 2.1 volts across the memory cell on $BL_1$. This disparity in potential could detrimentally affect memory operations associated with these memory cells. Accordingly, a mechanism to reduce disparity in voltage along source line 108, improving regularity and uniformity of memory operations for 1T1R memory cells 106, would provide an improvement for a memory circuit.

To alleviate disparate electrical characteristics in memory circuit 100, memory circuit 100 can comprise a dissipation line 110. In various embodiments, dissipation line 110 can be positioned between subsets of 1T1R memory cells 106. As depicted by FIG. 1, dissipation line 110 can be positioned between subsets of set of bitlines 102, however the subject disclosure is not so limited. In other embodiments, dissipation line 110 could be positioned between sets of wordlines or source lines (not depicted) depending on logical arrangement of memory cells of memory circuit 100, as suitable.

Dissipation line 110 can be electrically connected to or isolated from source line 108, by a switch 112. Switch 112 can be a transistor, or the like, having a large on/off current ratio. According to one or more embodiments, switch 112 can be controlled by wordline 104. For instance, switch 112 can be activated in response to an activation signal applied at wordline 104, and can be deactivated in response to a deactivation signal (or, e.g., absence of the activation signal) applied at wordline 104. When deactivated, switch 112 can resist current between source line 106 and dissipation line 110. When activated, switch 112 can short source line 106 to dissipation line 110, and vice versa. Therefore, when switch 112 is activated, dissipation line 110 can serve as a low resistance path to source line 106 that is parallel to set of bitlines 102. Moreover, because switch 112 and 1T1R memory cells 106 are controlled by wordline 104, switch 112 is activated/deactivated in conjunction with activation/deactivation of transistors of 1T1R memory cells 106.

The low resistance path between source line 106 and dissipation line 110 in response to activation of switch 112 can be utilized to mitigate disparate electrical effects of source line 108. For instance, with respect to a voltage applied at the right side of source line 108, resistance along source line 108 will increase further along the source line from the applied voltage. Accordingly, $BL_1$ will observe a larger voltage drop at an intersection of $BL_1$ and source line 108, as compared with a voltage drop observed at an intersection of $BL_2$ and source line 108, $BL_{N-1}$ and source line 108, and so on. However, a ground or zero volt source connected to dissipation line 110 (not depicted, but see FIG. 5, infra) provides a parallel short to ground (or zero volts) with respect to set of bitlines 102. This parallel short to ground can reduce the disparity in voltage drop caused by increased resistance of further points along source line 108 (as observed from a power node on source line 108—see FIG. 5). Accordingly, the voltage drop observed at an intersection of $BL_N$ and source line 108 will be closer in magnitude to the corresponding voltage drop observed at an intersection of $BL_1$ and source line 108, when switch 112 is activated and dissipation line 110 connected to a suitable ground, zero volt supply, etc. The reduced disparity in voltage along source line 108 can enable more 1T1R memory cells 106 within a page (e.g., connected to a common source line 108), improving memory density and the like. As described herein, other embodiments are provided, for example comprising multiple dissipation lines 110 per source line 108, multiple source lines 108 in an array, multiple wordlines 104 in the array, and so forth.

Figure 2:
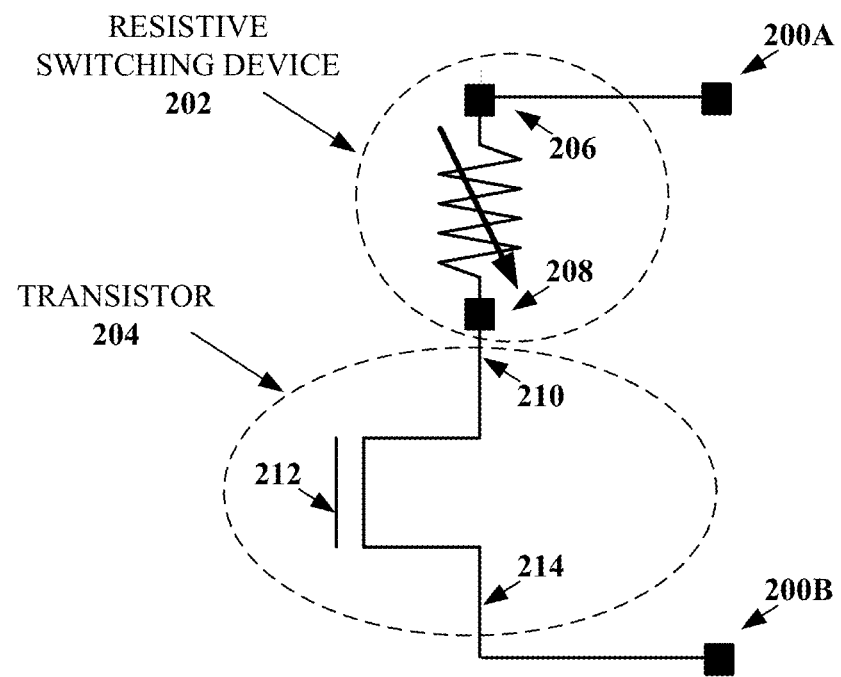
FIG. 2 illustrates a diagram of a sample one transistor-one resistor memory cell according to various embodiments of the subject disclosure.

FIG. 2 depicts a diagram of an example memory cell 100 according to one or more disclosed embodiments. Memory cell 100 can be a two-terminal 1T1R memory cell, having a first terminal 200A and a second terminal 200B related to controlling a memory operation of memory cell 100. In some embodiments, first terminal 200A can be connected to a first conductor of an integrated circuit (e.g., a bitline as depicted in FIG. 1, supra, or a wordline, source line, dataline, etc., in alternative embodiments) and second terminal 200B can be connected to a second conductor of the integrated circuit (e.g., a source line, though in alternative embodiments a bitline, wordline, dataline, and so forth). By applying a suitable electric signal to first terminal 200A or second terminal 200B, a desired current, voltage, field, and so forth, can be applied to a resistive switching device 202 of memory cell 100. A suitable program signal, for instance, could be applied to program resistive switching device 202, a suitable erase signal could be applied to erase resistive switching device 202, and so on (e.g., see FIG. 6, infra).

In various embodiments, resistive switching device 202 can be a two-terminal switching device having a first switching device terminal 206 and a second switching device terminal 208. In at least one embodiment, first switching device terminal 206 can be the same node as first terminal 200A, though the subject disclosure is not limited to this embodiment(s). In other embodiments, resistive switching device 202 can be a resistive random access memory, or other suitable resistive memory. However, in at least some embodiments, resistive switching device 202 can instead be another suitable two-terminal memory technology, such as a phase-change memory, a magneto-resistive memory, a ferroelectric memory, an organic memory, a conductive bridging memory, or the like.

Resistive switching device 202 can be connected in series to a transistor 204. Transistor 204 can be a gate-controlled three-terminal transistor, in various embodiments. In such embodiments, a first transistor terminal 210 (e.g., a source, a drain) can be connected to second switching device terminal 208. Additionally, a second transistor terminal 214 (e.g., a drain, a source) can be connected to second terminal 200B. A gate terminal 212 of transistor 204 can be utilized to activate or deactivate transistor 204. In some embodiments, transistor 204 is in a conductive state when activated and a non-conductive state when deactivated, though another convention could be used in other embodiments.

In operation, transistor 204 can be activated or deactivated to mitigate or avoid leakage currents at resistive switching device 202. For instance, referring back to FIG. 1, an array of 1T1R memory cells 106 can be configured to share a common point at a source line 108. In such an arrangement, unintended current through one or more deactivated memory cells could affect operations of an activated memory cell. As an illustrative example, resistive switching device 202 could have a resistance on an order of mega ohms or higher in a non-conducting state, yet while in a conducting state, the resistance could be on the order of hundreds of ohms, tens of ohms or even less. Accordingly, even a small capacitive voltage on a bitline connected to a conducting resistive switching device 202 can result in relatively high leakage current observed at source line 108. Accordingly, transistor 204 can be deactivated to mitigate leakage current of a 1T1R memory cell, regardless of whether an associated resistive switching device 202 is in a conducting or non-conducting state. For example, if transistor 204 has resistance of ten mega-ohms when deactivated, a few milliamps of leakage current—quite large in the context of memory operations—would be mitigated to a few tenths of a nanoamp. This would generally be quite manageable, even for high-density blocks of memory in which thousands or tens of thousands (or more) of memory cells are commonly connected to a source line 108.

Figure 3:
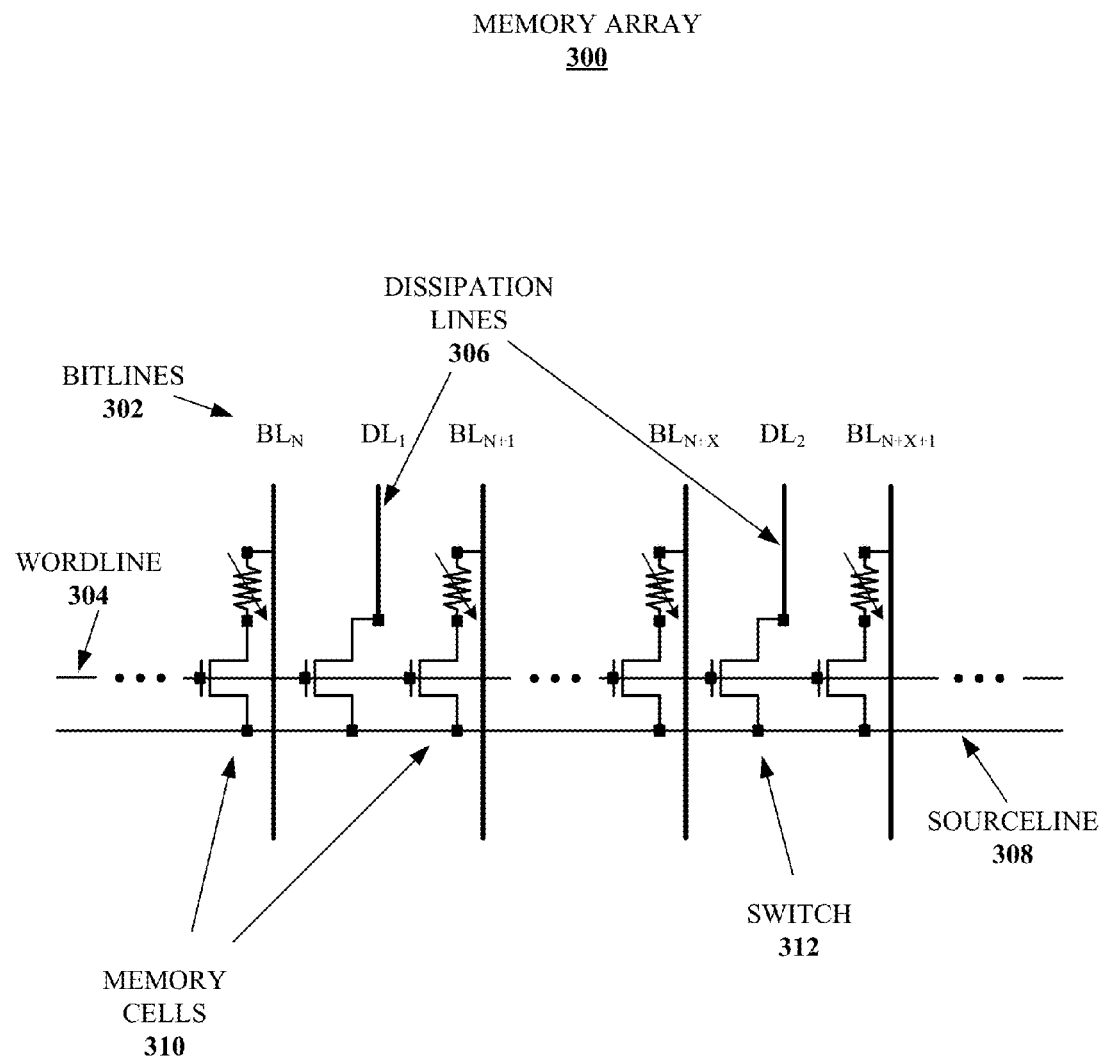
FIG. 3 depicts a circuit diagram of an example memory array comprising multiple dissipation lines for providing improved regularity of the array.

FIG. 3 depicts a circuit diagram of an example memory array 300 according to alternative or additional embodiments of the present disclosure. Memory array 300 can comprise multiple dissipation lines to reduce electrical disparity of large electrical components. Use of multiple dissipation lines per page, block, etc., can facilitate larger page sizes, larger block sizes, and higher operational uniformity even for high density, high capacity memory devices.

Memory array 300 can comprise a set of bitlines 302, including bitlines $BL_N$, $BL_{N+1}$, ... $BL_{N+X}$, $BL_{N+X+1}$, where N and X are suitable positive integers. In addition, set of bitlines 302 can include additional bitlines to the left of $BL_N$ (as depicted on FIG. 3), which can include bitlines $BL_{N-1}$, $BL_{N-2}$, and so on. Further, set of bitlines 302 can include additional bitlines to the right of $BL_{N+X+1}$, which can include $BL_{N+X+2}$, $BL_{N+X+3}$, and so forth.

Respective ones of set of bitlines 302 can be connected to one of a set of memory cells 310. Particularly, memory cells 310 can have a first terminal connected to one of set of bitlines 302, and can be individually controlled via respective ones of set of bitlines 302. Second terminals of memory cells 310 can be connected to a source line 308, which serves as a second point of electrical control for memory cells 310. Additionally, a wordline 304 can be employed to activate or deactivate memory cells 310 connected to source line 308. In various embodiments, memory cells 310 can be 1T1R memory cells comprising a resistive switching device 202 in series with a transistor 204, for example as depicted in FIG. 2. However, it should be understood that memory array 300 is not limited to a memory array comprising 1T1R memory cells, but can be implemented for other memory cell arrangements in various embodiments.

Between subsets of bitlines 302 are one or more dissipation lines 306. As depicted, memory array 300 can include $DL_1$ between $BL_N$ and $BL_{N+1}$, and $DL_2$ between $BL_{N+X}$ and $BL_{N+X+1}$. Other dissipation lines 306—not depicted—can be included between other subsets of set of bitlines 302 as well.

Dissipation lines 306 can comprise respective switches 312 configured to electrically connect or electrically isolate source line 308 to/from respective ones of dissipation lines 316. When electrically connected, a dissipation line 306 provides a low resistance path between source line 308 and the dissipation line 306, in parallel to set of bitlines 302. When electrically isolated, switches 312 can mitigate or avoid leakage current traversing dissipation lines 306 to other source lines 308, for instance. Further to the above, respective switches 312 can be controlled by wordline 304. In this manner, switches 312 can be activated when memory cells 310 connected to source line 308 are activated, and switches 312 can be deactivated when memory cells 310 connected to source line 308 are deactivated.

Dissipation lines 310 can be connected to ground, or a voltage source, or left floating (not driven at a particular voltage). When connected to ground, activation of wordline 304 activates switches 312 and provides a plurality of low resistance paths from source line 308 to ground that are in parallel to set of bitlines 302. These low resistance paths to ground can reduce disparity in voltage dropped along source line 308, improving uniformity of voltage observed by memory cells 310. In some disclosed embodiments, memory array 300 can have a first number of dissipation lines 306 and a second number of bitlines 302. In one or more embodiments, a ratio of the first number to the second number can be a positive integer. The positive integer can be selected to achieve a target uniformity in voltage along source line 308, in one example.

Figure 4:
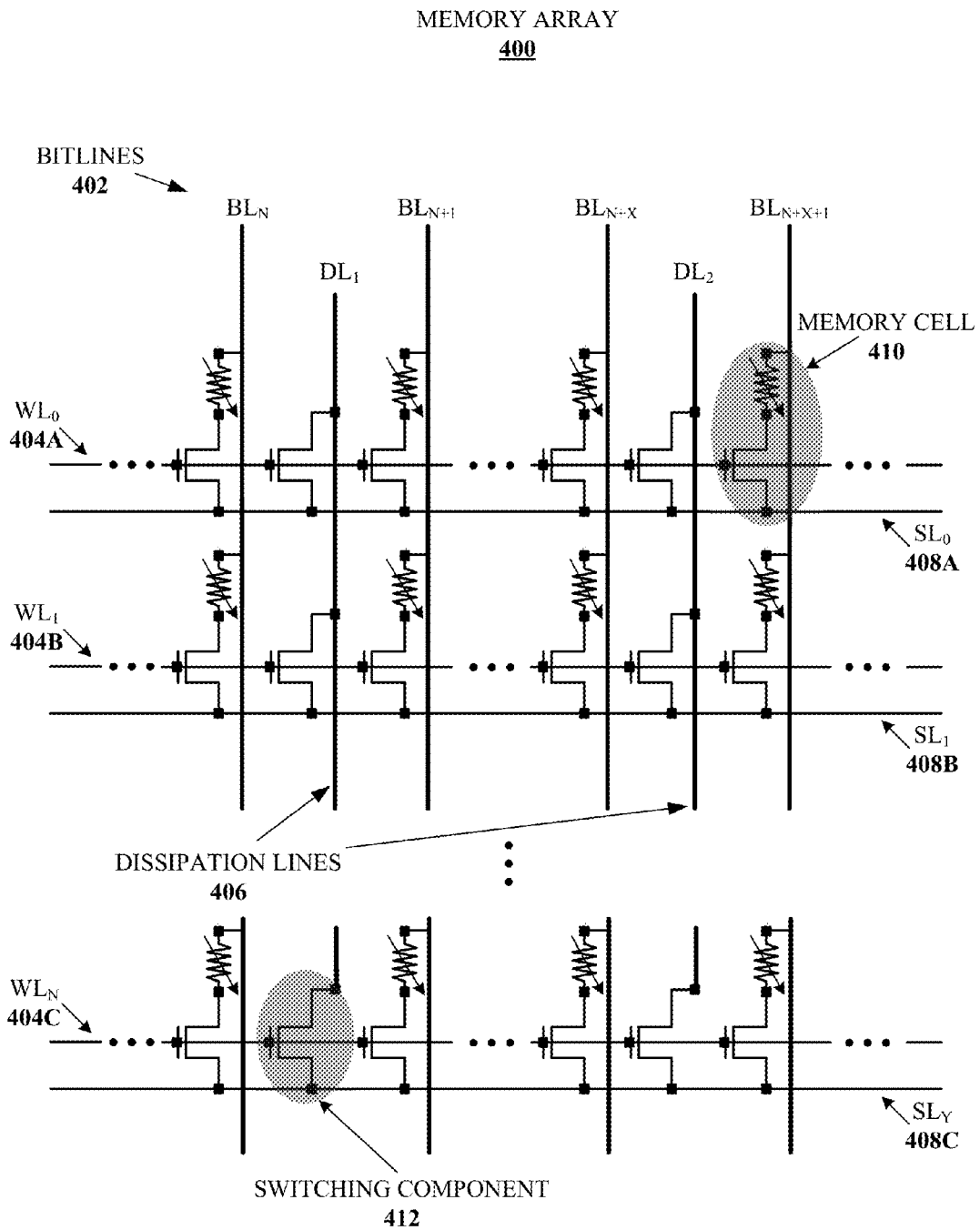
FIG. 4 illustrates a circuit diagram of a sample two-dimensional memory array having multiple dissipation lines per row, in an embodiment.

FIG. 4 illustrates a circuit diagram of an example memory array 400 according to still other disclosed embodiments. Memory array 400 can comprise a two-dimensional array of memory cells. Respective rows, or pages, of the two-dimensional array can have one or more dissipation lines, as described herein, to improve uniformity of memory operations for memory cells sharing the rows or pages. In various embodiments, memory cells of memory array 400 can comprise two-terminal memory devices (e.g., resistive switching memory) to provide improved operational performance. Memory array 400 can therefore provide improved operation even for high density, high capacity memory systems.

Memory array 400 can comprise bitlines 402, including bitlines $BL_N$, $BL_{N+1}$, ..., $BL_{N+X}$, $BL_{N+X+1}$, that are at least in part orthogonal to a set of source lines, including $SL_0$ 408A, $SL_1$ 408B, ..., $SL_Y$ 408C (referred to collectively as source lines 408A-408C), where Y is a positive integer. Memory array 400 comprises memory cells 410 situated at respective intersections of bitlines 402 and source lines 408A-408C. In various embodiments, memory cells 410 can be 1T1R memory cells comprising a resistive switching device (e.g., a resistive filament device) in series with a switch (e.g., a transistor). A set of wordlines, including wordlines $WL_0$ 404A, $WL_1$ 404B, ..., $WL_N$ 404C (referred to collectively as wordlines 404A-404C) are connected to gate terminals of the memory cell switches to activate or deactivate rows of memory cells. Individual memory cells 410 can be addressed by a corresponding one of bitlines 402 and one of source lines 408A-408C. An electrical signal applied to a bitline and source line associated with a particular memory cell 410 facilitates memory operations for respective ones of the memory cells 410.

Memory array 400 can comprise a set of dissipation lines 406 situated between subsets of bitlines 402. Dissipation lines 406 can be indirectly connected to source lines 408A-408C via a set of switching components 412. In addition, switching components 412 connected to a particular one of source lines 408A-408C can be controlled via one of wordlines 404A-

404C associated with that particular source line. For example, wordline $WL_1$ 404B can activate switching components 412 connected to $SL_1$ 408B, making these switching components 412 conducting. Accordingly, $SL_1$ 408B is electrically connected to dissipation lines 406. In addition, other wordlines of memory array 400 (or at least a subset thereof), such as $WL_0$ 404A or $WL_N$ 404C, can be deactivated. Switching components 412 connected to $SL_0$ 408A or $SL_Y$ 408C can therefore be non-conducting, isolating $SL_0$ 408A or $SL_Y$ 408C from dissipation lines 406. Accordingly, memory array 400 can be configured to mitigate or avoid leakage current between source lines 408A-408C on dissipation lines 406.

Figure 5:
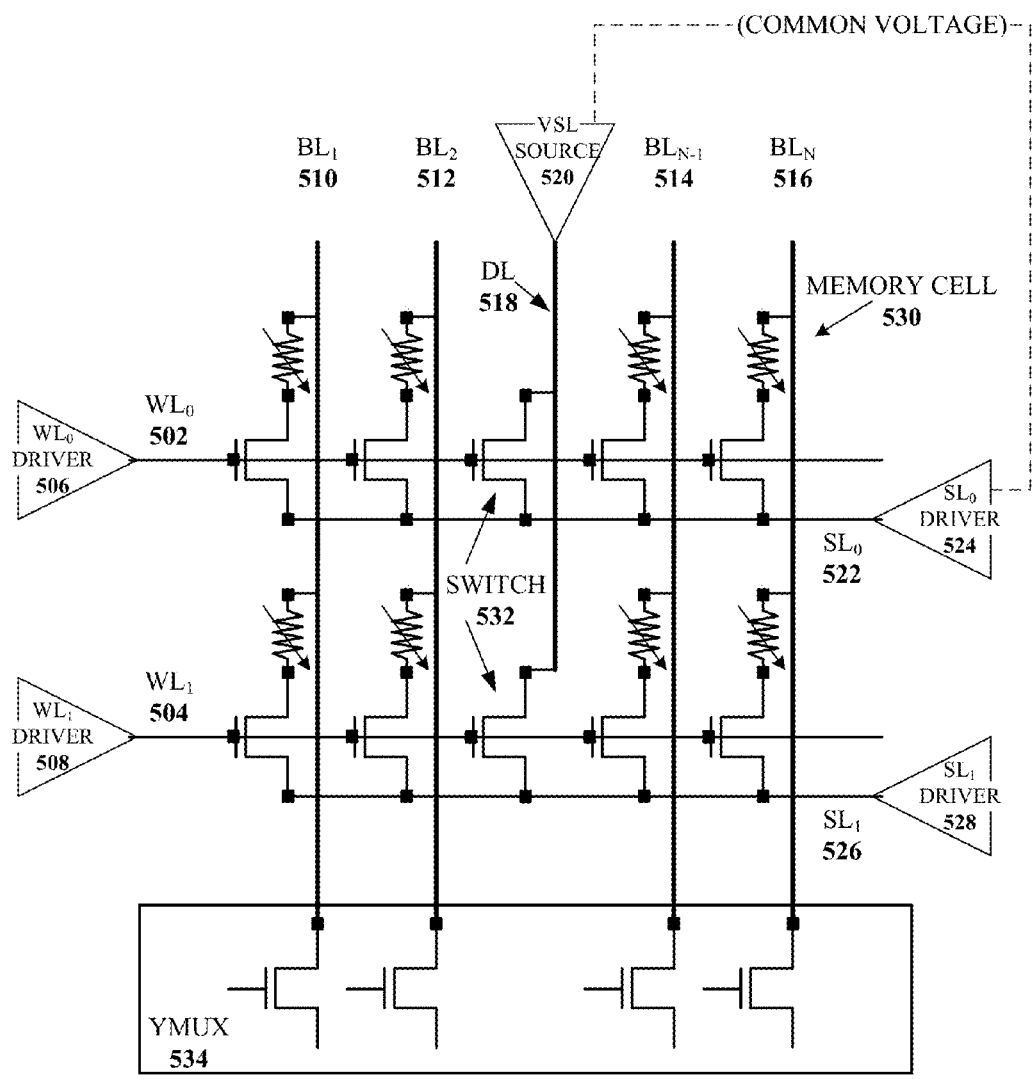
FIG. 5 depicts a circuit diagram of an example memory array comprising an embedded source line driver, in further embodiments.

FIG. 5 illustrates a circuit diagram of an example 1T1R memory cell array 500 according to still other disclosed embodiments. 1T1R memory cell array 500 illustrates some circuitry to facilitate control of memory cells and performance of memory operations. Additionally, 1T1R memory cell array 500 illustrates additional circuitry for addressing individual bitlines and source lines of 1T1R memory cell array 500.

1T1R memory cell array 500 can comprise a plurality of wordlines, including $WL_0$ 502 and $WL_1$ 504, connected respectively to power source(s) $WL_0$ driver 506 and $WL_1$ driver 508 (which can be a single power source gated through a suitable multiplexing circuit, such as Ymux 534, or multiple power sources in some embodiments). Orthogonal to the wordlines are a plurality of bitlines, including $BL_1$ 510, $BL_2$ 512, ..., $BL_{N-1}$ 514, $BL_N$ 516 (referred to collectively as bitlines 510-516), where N is a suitable positive integer. Between a subset of the plurality of bitlines is a dissipation line 518. Though dissipation line 518 is depicted as being situated between an equal number of bitlines (e.g., two bitlines on the left of dissipation line 518 and two bitlines to the right thereof), other arrangements could be implemented in some disclosed embodiments. Furthermore, embodiments having multiple dissipation lines 518 situated between different subsets of the bitlines are contemplated (e.g., see FIGS. 3 and 4, infra). A power source, VSL 520, can be connected to dissipation line 518 for applying an electric signal to dissipation line 518. VSL 520 can also be a zero volt source, or a ground, to drive dissipation line 518 at zero volts or ground. In addition, VSL 520 (as well as wordline drivers 506, 508 and source line drivers 524, 528) can be disconnected from dissipation line 518 (or associated wordlines, source lines) to leave dissipation line 518 floating (e.g., un-powered, non-grounded, etc.).

Further to the above, 1T1R memory cell array 500 can comprise a set of source lines, including $SL_0$ 522 and $SL_1$ 526 (referred to collectively as source lines 522, 526). The source lines are connected respectively to a source line power source(s). $SL_0$ 522 is connected to $SL_0$ driver 524, and $SL_1$ 526 is connected to $SL_1$ driver 528. Source line drivers can be separate power sources, or a single power source (e.g., gated by a suitable multiplexer, such as Ymux 534). At an intersection of one of bitlines 510-516 and one of source lines 522, 526 is a memory cell 530. In some embodiments, memory cells 530 can be substantially similar to 1T1R memory cell 200 of FIG. 2, supra, although the subject disclosure is not limited to such embodiments. Memory cells 530 connected to $SL_0$ 522 or $SL_1$ 526 can be activated/deactivated by an associated wordline. When activated, an electric signal applied to a bitline and source line affects a memory component (e.g., a resistive switching device) of a memory cell 530 located at an intersection of the bitline and source line. Utilizing suitable electric signals (e.g., see FIG. 6, infra), the memory component can be programmed, erased, read, and so on. A multiplexer, Ymux 534, can be utilized to power selected ones of bitlines 510-516 to facilitate control of individual memory cells 530, ground selected bitlines 510-516, leave selected other bitlines 510-516 floating, or the like.

In at least one embodiment, VSL source 520 connected to dissipation line 518 and a source line driver 524, 528 associated with a selected one of source lines 522, 526 can be driven by a common voltage for a memory operation. For instance, in the context of a memory operation on one of memory cells 530 connected to $SL_0$ 522, the selected source line is $SL_0$ 522. According to this embodiment, VSL source 520 and $SL_0$ driver 524 can be grounded, driven at a common voltage, or left floating, equally (e.g., see FIG. 6, infra, comparing operational voltages for the dissipation line and source line). In various aspects of the embodiment(s), VSL source 520 and the source line driver 524, 528 for the selected one of source lines 522, 526 can be driven by a common voltage for at least one memory operation selected from a group of memory operations consisting of: a read operation, a program operation, or an erase operation.

Dissipation line 518 can comprise a set of switches 532. Switches 532 can indirectly connect dissipation line 518 to respective ones of source lines 522, 526. Note that while bitlines 510-516 are connected to Ymux 534, dissipation line 518 terminates at a switch 532 of the bottom-most source line (e.g., $SL_1$ 526 in the example embodiment depicted by 1T1R memory cell 500). Accordingly, dissipation line 518 can be powered by VSL 520 separately from Ymux 534 and a bitline power source(s) (not depicted) connected to Ymux 534. Additionally, respective switches 532 can electrically connect or disconnect dissipation line 518 to an associated one of source lines 522, 526. The switches 532 are activated or deactivated by associated one of wordlines 502, 504. Accordingly, when $WL_0$ 502 activates memory cells connected to $SL_0$ 522, an associated one of switches 532 electrically connects $SL_0$ 522 to dissipation line 518. Likewise, when $WL_0$ 502 deactivates memory cells connected to $SL_0$ 522, the associated one of switches 532 electrically disconnects $SL_0$ 522 from dissipation line 518. Accordingly, switches 532 can be controlled to mitigate or prevent leakage current between source lines 522, 526 via dissipation line 518.

In operation, activation of $WL_0$ 502 (or $WL_1$ 504) activates memory cells 530 connected to $SL_0$ 522 (or $SL_1$ 526, respectively), and connects dissipation line 518 to $SL_0$ 522. Deactivation of $WL_1$ 504 (or $WL_0$ 502) deactivates memory cells 530 connected to $SL_1$ 526 (or $SL_0$, respectively), and disconnects dissipation line 518 from $SL_1$ 526. For memory cells 530 controlled by current, deactivation of the memory cell can reduce current through the memory cell to negligible magnitudes, effectively insulating the memory cell from a signal applied at an associated one of bitlines 510-516. For memory cells controlled by electric field or voltage, deactivation of the memory cell in conjunction with suitable control of an associated source line voltage can provide a similar effect. For instance, if 3 volts is applied at $BL_1$ 510 (e.g., to program a memory cell on $SL_0$ 522), 3 volts can also be applied by $SL_1$ driver 528 to $SL_1$ 526 to cause a zero potential difference across the memory cell at $BL_1$ 510 and $SL_1$ 526. However, as described herein, where source lines 522, 526 are long and therefore have significant disparity in electrical resistance between two points along the source line, 3 volts applied by $SL_1$ driver 528 can result in different voltages at the two different points. Activation of a switch 532 connected to that source line, and connecting dissipation line 518 to ground at VSL 520 provides a low resistance path to ground in parallel with bitlines 510-516 (for the activated source line). This reduces the disparity in voltage drop between the two points, improving uniformity of operation for memory cells commonly connected to source lines 522, 526, and enabling larger source lines (e.g., with multiple dissipation lines 518) while mitigating adverse effects thereof. Accordingly, 1T1R memory cell array 500 can provide a significant improvement to two-terminal memory devices, for instance in terms of increased memory density, increased capacity, and performance reliability.

FIG. 6 illustrates a diagram of example operational methods 600 for a circuit comprising two-terminal memory devices, according to various disclosed embodiments. Operational methods 600 include a read operation 602, program operation 604 and erase operation 606. Respective operational methods provide respective signal information for selected bitlines, unselected bitlines, an associated source line and an associated dissipation line. Operational methods 600 are not intended to be exhaustive; other methods for operating disclosed memory devices made known to one of ordinary skill in the art by way of the context provided herein are considered within the scope of the present disclosure.

Read operation 602 can comprise applying a read voltage to a selected bitline, e.g., comprising a target memory cell(s) for the read operation. A suitable read voltage can comprise 1 volt, 1.5 volts, 2 volts, or other suitable voltage for reading a two-terminal memory based on the two-terminal memory technology employed for the memory cell(s). Additionally, zero volts can be applied to unselected bitlines in one embodiment, and in an alternate embodiment, unselected bitlines can be left floating. A source line associated with the target memory cell(s) can be set to zero volts, resulting in a potential difference approximately equal to the read voltage across the target memory cell(s). A dissipation line associated with the source line can be set to zero volts (or ground), to provide a low resistance path to ground that is parallel to the selected bitline, thereby mitigating voltage non-uniformity of the selected source line. Although not depicted, a wordline associated with the source line can be activated (e.g., set to an activation voltage), other wordlines can be deactivated, and non-selected source lines can be left floating, set to the read voltage, or other suitable signal to minimize voltage across memory cells connected to the non-selected source lines.

Program operation 604 can comprise applying a program voltage to a selected bitline, e.g., comprising a target memory cell(s) for the program operation. A suitable program voltage can comprise 2 volts, 2.5 volts, 3 volts, or other suitable voltage for programming a two-terminal memory based on the two-terminal memory technology. In one embodiment, zero volts can be applied to unselected bitlines for the program operation 604. In an alternative embodiment, the unselected bitlines can be left floating. Additionally, zero volts can be applied to a selected source line, and zero volts can be applied to a dissipation line(s) connected to the selected source line. In further embodiments, a wordline associated with the source line can be activated, other wordlines can be deactivated, and non-selected source lines can be left floating, set to the program voltage or the like.

Erase operation 606 can comprise applying zero volts to a selected bitline, e.g., comprising a target memory cell(s) for the erase operation. In one embodiment, zero volts can be applied to unselected bitlines. In an alternative embodiment, the unselected bitlines can be left floating. Additionally, an erase voltage can be applied at a selected source line connected to the target memory cell(s). The erase voltage can be 2 volts, 1.5 volts, 2.5 volts, or other suitable voltage for erasing the target memory cell(s) based on a technology of the target memory cell(s). Furthermore, the erase voltage can be applied to a dissipation line(s) connected to the selected source line. In one or more additional embodiments, a wordline associated with the selected source line can be activated; non-selected wordlines can be deactivated, and non-selected source lines can be left floating, set to the erase voltage, or the like.

The aforementioned diagrams have been described with respect to interaction between several components of a memory array, or electronic circuits comprised of memory cells. It should be appreciated that in some suitable alternative aspects of the subject disclosure, such diagrams can include those components and circuits specified therein, some of the specified components/circuits, or additional components/circuits. Sub-components can also be implemented as electrically connected to other sub-components rather than included within a parent architecture. Additionally, it is noted that one or more disclosed processes can be combined into a single process providing aggregate functionality. As one example, fabricating a memory cell, memory array, etc., as part of a fabrication process involving an integrated circuit, a deposition process can comprise a fill or etching process, an anneal process, or the like, or vice versa, to facilitate deposition, filling or etching of memory cell layers by way of an aggregate process. Components of the disclosed circuits can also interact with one or more other components not specifically described herein but known by those of skill in the art.

Figure 7:
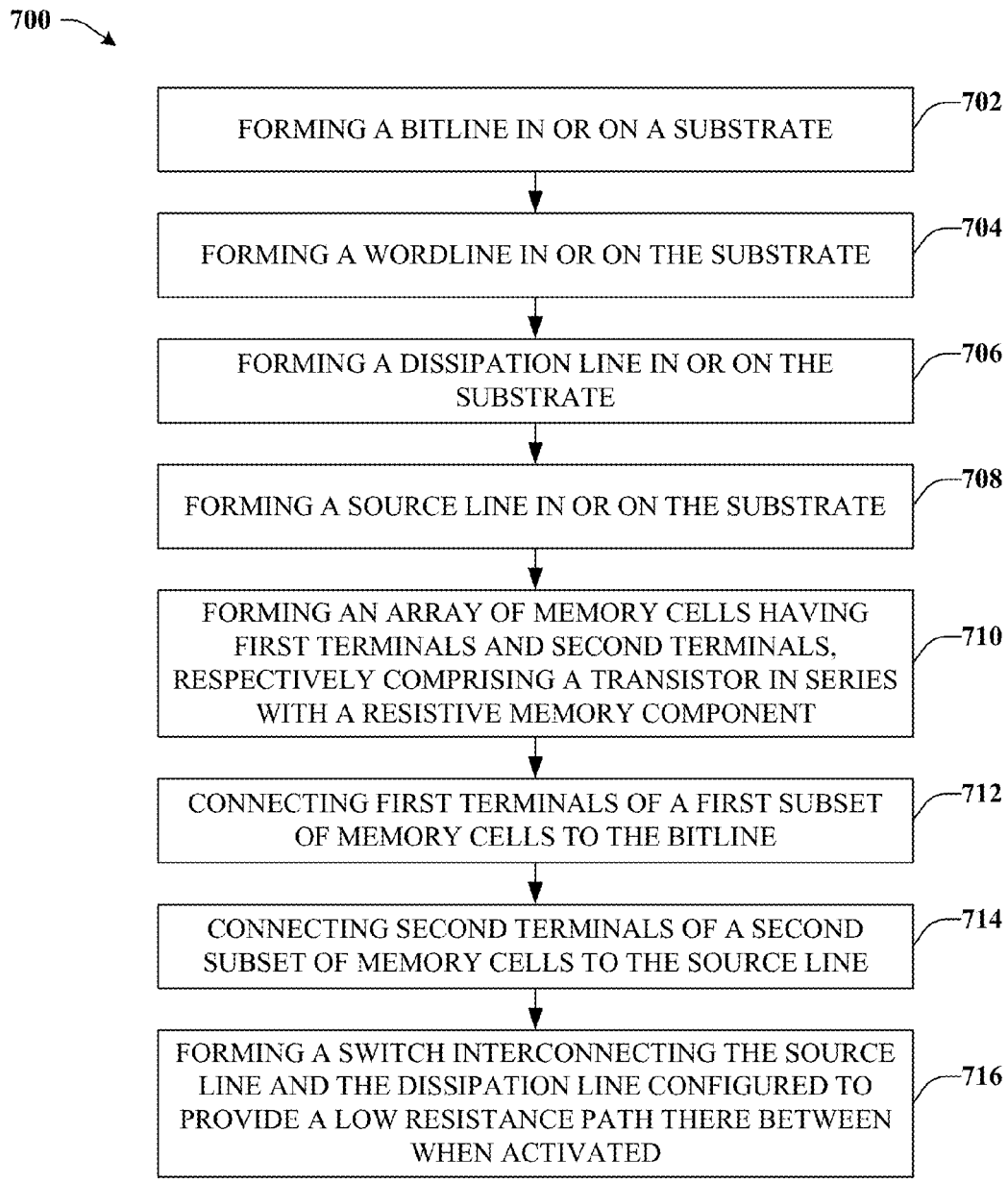
FIG. 7 depicts a flowchart of a sample method for fabricating a memory array according to additional embodiments.
Figure 8:
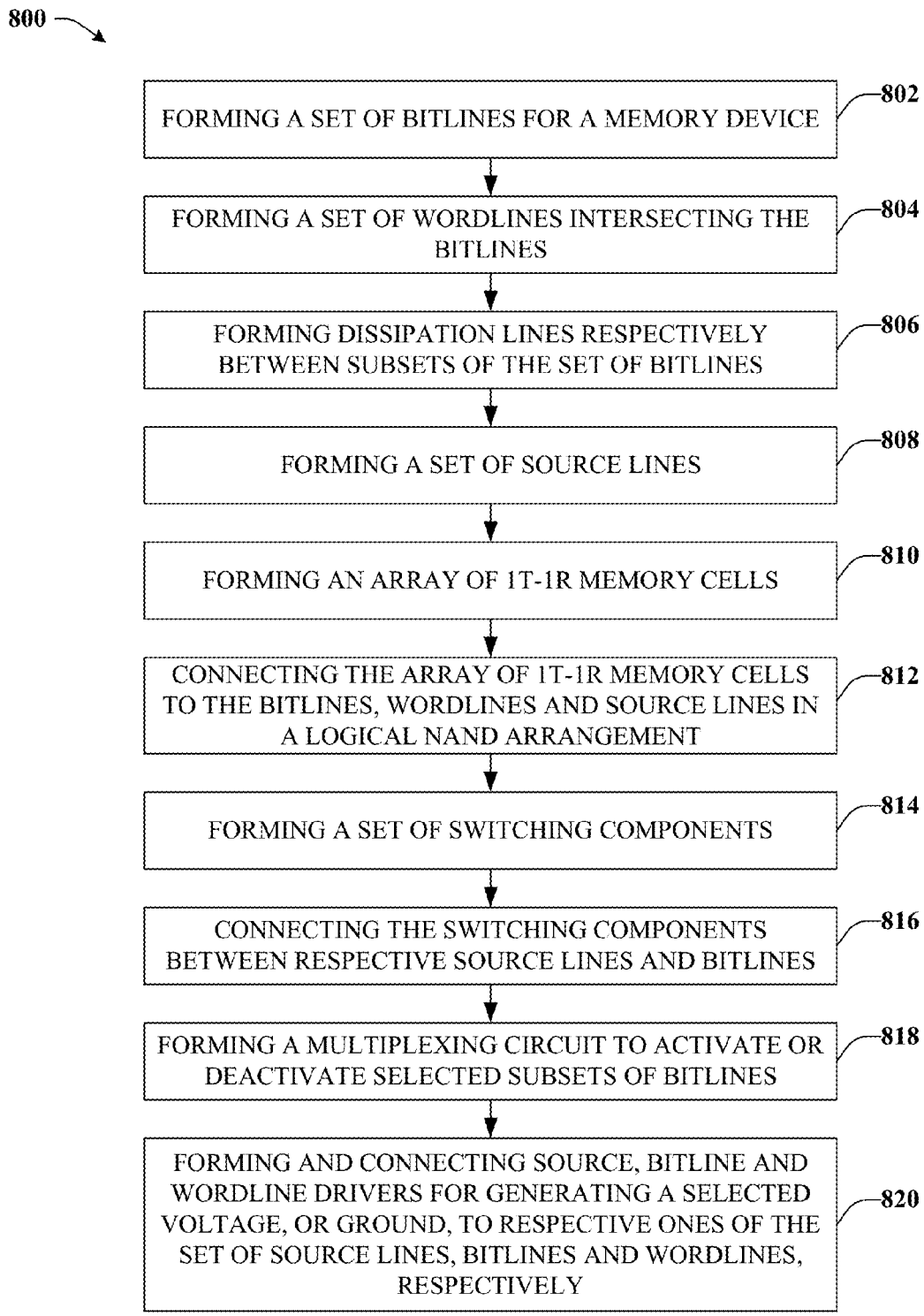
FIG. 8 illustrates a flowchart of an example method for fabricating a memory array to provide improved regularity of metal conductors, in an embodiment(s).

In view of the exemplary diagrams described supra, process methods that can be implemented in accordance with the disclosed subject matter will be better appreciated with reference to the flow charts of FIGS. 7 and 8. While for purposes of simplicity of explanation, the methods of FIGS. 7 and 8 are shown and described as a series of blocks, it is to be understood and appreciated that the claimed subject matter is not limited by the order of the blocks, as some blocks may occur in different orders or concurrently with other blocks from what is depicted and described herein. Moreover, not all illustrated blocks may be required to implement the methods described herein. Additionally, it should be further appreciated that the methods disclosed throughout this specification are capable of being stored on an article of manufacture to facilitate transporting and transferring such methodologies to an electronic device. The term article of manufacture, as used, is intended to encompass a computer program accessible from any suitable computer-readable device, device in conjunction with a carrier, storage medium, or the like, or a suitable combination thereof.

FIG. 7 illustrates a flowchart of an example method 700 for fabricating a memory device, according to additional aspects of the present disclosure. At 702, method 700 can comprise forming a bitline in or on a substrate. At 704, method 700 can comprise forming a wordline in or on the substrate. At 706, method 700 can comprise forming a dissipation line in or on the substrate. In various embodiments, the dissipation line can be situated adjacent the bitline. At 708, method 700 can comprise forming a source line in or on the substrate.

Further to the above, at 710, method 700 can comprise forming an array of memory cells having respective first memory terminals and respective second memory terminals. Additionally, in one or more embodiments, forming the array of memory cells can comprise forming a transistor in series with a two-terminal memory device (e.g., a resistive memory component) for respective memory cells of the array of memory cells. At 712, method 700 can comprise connecting respective first memory terminals of a first subset of the array of memory cells to the bitline. At 714, method 700 can comprise connecting respective second memory terminals of a second subset of the array of memory cells to the source line. Moreover, at 716, method 700 can comprise forming a switch interconnecting the source line and the dissipation line. In one or more embodiments, the switch can be configured to provide a low resistance path between the source line and the dissipation line in response to activation of the switch. Additionally, the switch can be configured to provide a high resistance path between the source line and the dissipation line in response to deactivation of the switch. According to further embodiments, the switch can be commonly connected with the second subset of the memory cells of the memory array to a wordline of the memory array, such that the switch is activated when the second subset of the memory cells are activated, and the switch is deactivated when the second subset of the memory cells are deactivated.

FIG. 8 illustrates a flowchart of an example method 800 according to alternative or additional aspects of the subject disclosure. At 802, method 800 can comprise forming a set of bitlines for a memory device. At 804, method 800 can comprise forming a set of wordlines for the memory device. In an embodiment(s), the wordlines can be formed in a direction crossing the bitlines. Further, at 806, method 800 can comprise forming dissipation lines respectively between different pairs of bitlines of the set of bitlines. At 808, method 800 can comprise forming a set of source lines. In various embodiments, the source lines can be formed in a direction crossing the bitlines (e.g., orthogonal, or in part orthogonal).

In addition to the foregoing, method 800, at 810, can comprise forming an array of 1T1R memory cells. At 812, method 800 can comprise connecting the array of 1T1R memory cells to the bitlines, wordlines and source lines. In one embodiment, the array of 1T1R memory cells can be connected in a logical NAND arrangement, although the subject disclosure is not so limited, and other logical arrangements can be implemented in other disclosed embodiments where suitable to one of ordinary skill in the art.

At 814, method 800 can comprise forming a set of switching components. At 816, method 800 can comprise connecting respective switching components between respective pairs of source lines and bitlines of the memory array, at an intersection of respective bitlines and respective source lines. At 818, method 800 can comprise forming a multiplexing circuit to activate or deactivate selected subsets of bitlines. At 820, method 800 can comprise forming and connecting source line, bitline and wordline drivers for generating a selected voltage, or ground, to respective ones of the set of source lines, bitlines and wordlines, respectively.

Figure 9:
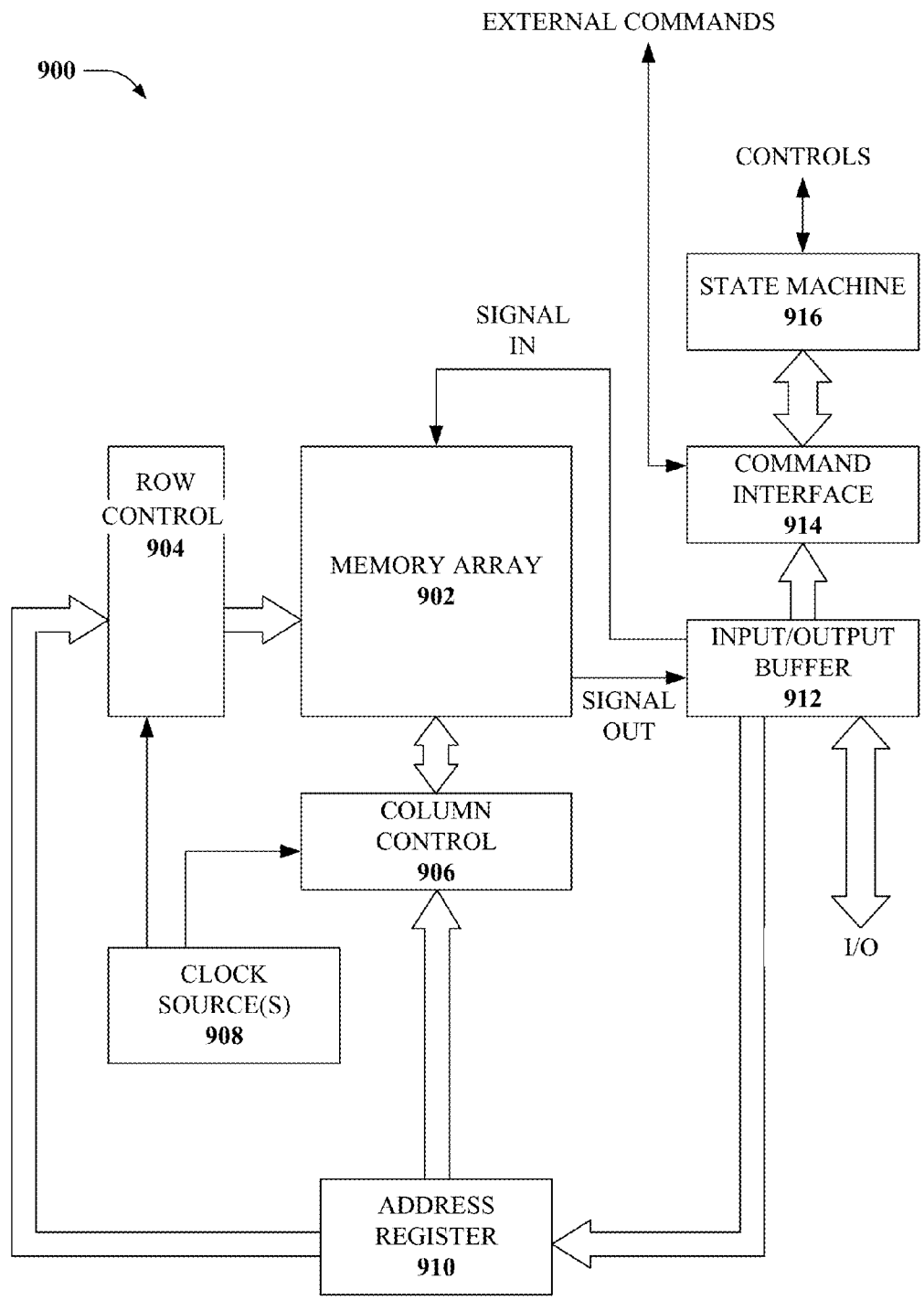
FIG. 9 depicts a block diagram of a sample operating and control environment for a memory device according to various disclosed embodiments.

In order to provide a context for the various aspects of the disclosed subject matter, FIG. 9, as well as the following discussion, is intended to provide a brief, general description of a suitable environment in which various aspects of the disclosed subject matter can be implemented or processed. While the subject matter has been described above in the general context of electronic memory and process methodologies for fabricating and operating such electronic memory, those skilled in the art will recognize that the subject disclosure also can be implemented in combination with other components/layers of memory, memory architectures, or process methodologies. Moreover, those skilled in the art will appreciate that the disclosed processes can be practiced with a processing system or a computer processor, either alone or in conjunction with a host computer, which can include single-processor or multiprocessor computer systems, mini-computing devices, mainframe computers, as well as personal computers, hand-held computing devices (e.g., PDA, phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone electronic devices, such as a memory card, Flash memory module, removable memory, or the like. In a distributed computing environment, program modules can be located in both local and remote memory storage modules or devices.

FIG. 9 illustrates a block diagram of an example operating and control environment 900 for a resistive memory array 902 according to aspects of the subject disclosure. In at least one aspect of the subject disclosure, resistive memory array 902 can comprise a variety of resistive memory cell technology. Particularly, resistive memory array can be configured or operated to mitigate or avoid sneak path currents of the resistive memory array, as described herein.

A column controller 906 can be formed adjacent to resistive memory array 902. Moreover, column controller 906 can be electrically coupled with bit lines of resistive memory array 902. Column controller 906 can control respective bitlines, applying suitable program, erase or read voltages to selected bitlines.

In addition, operating and control environment 900 can comprise a row controller 904. Row controller 904 can be formed adjacent to column controller 906, and electrically connected with word lines of resistive memory array 902. Row controller 904 can select particular rows of memory cells with a suitable selection voltage. Moreover, row controller 904 can facilitate program, erase or read operations by applying suitable voltages at selected word lines.

A clock source(s) 908 can provide respective clock pulses to facilitate timing for read, write, and program operations of row control 904 and column control 906. Clock source(s) 908 can further facilitate selection of word lines or bit lines in response to external or internal commands received by operating and control environment 900. An input/output buffer 912 can be connected to an external host apparatus, such as a computer or other processing device (not depicted) by way of an I/O buffer or other I/O communication interface. Input/output buffer 912 can be configured to receive write data, receive an erase instruction, output readout data, and receive address data and command data, as well as address data for respective instructions. Address data can be transferred to row controller 904 and column controller 906 by an address register 910. In addition, input data is transmitted to resistive memory array 902 via signal input lines, and output data is received from resistive memory array 902 via signal output lines. Input data can be received from the host apparatus, and output data can be delivered to the host apparatus via the I/O buffer.

Commands received from the host apparatus can be provided to a command interface 914. Command interface 914 can be configured to receive external control signals from the host apparatus, and determine whether data input to the input/output buffer 912 is write data, a command, or an address. Input commands can be transferred to a state machine 916.

State machine 916 can be configured to manage programming and reprogramming of resistive memory array 902. State machine 916 receives commands from the host apparatus via input/output interface 912 and command interface 914, and manages read, write, erase, data input, data output, and like functionality associated with resistive memory array 902. In some aspects, state machine 916 can send and receive acknowledgments and negative acknowledgments regarding successful receipt or execution of various commands.

To implement read, write, erase, input, output, etc., functionality, state machine 916 can control clock source(s) 908. Control of clock source(s) 908 can cause output pulses configured to facilitate row controller 904 and column controller 906 implementing the particular functionality. Output pulses can be transferred to selected bit lines by column controller 906, for instance, or word lines by row controller 904, for instance.

In connection with FIG. 10, the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

Figure 10:
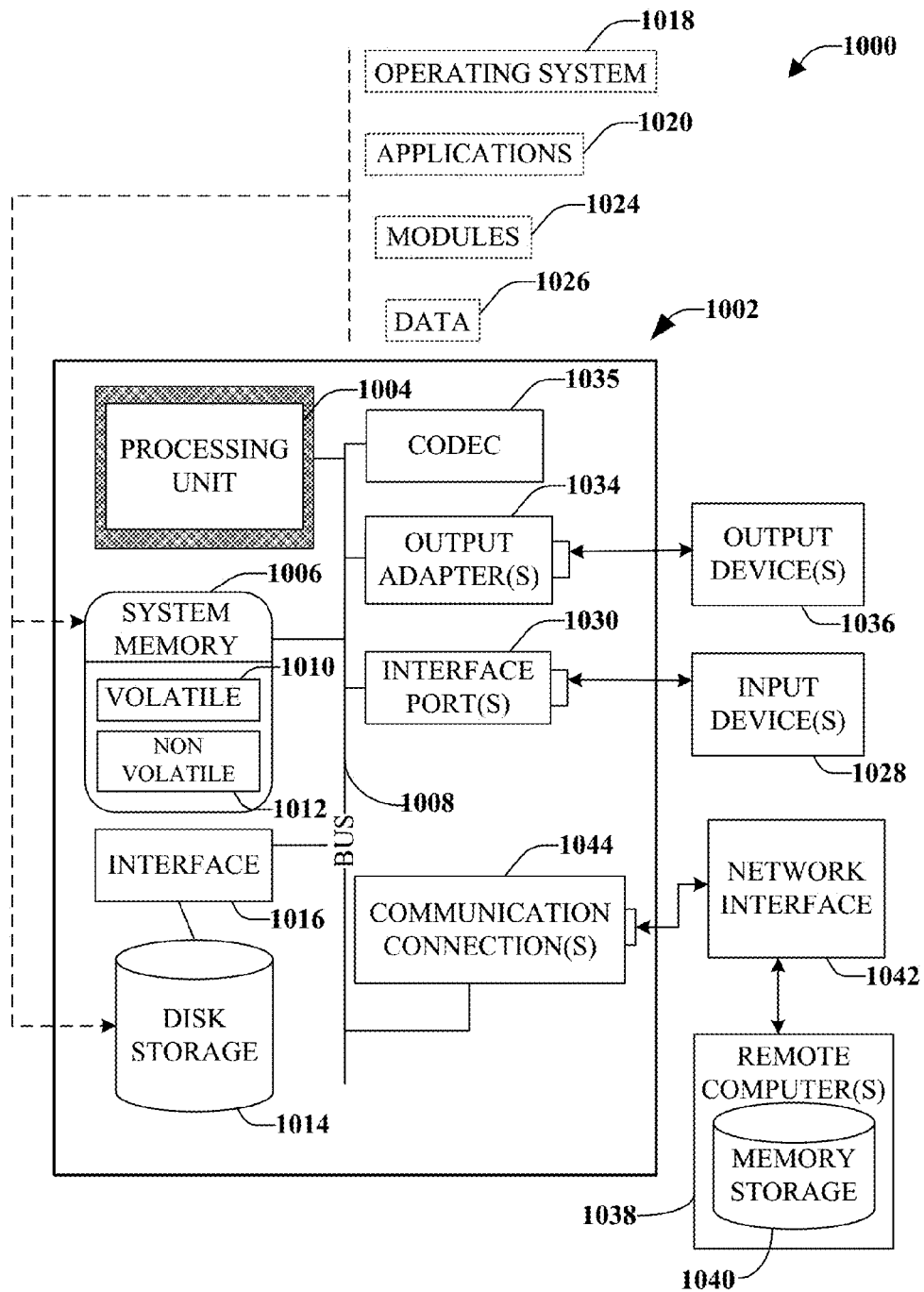
FIG. 10 illustrates a block diagram of an example computing environment that can be implemented in conjunction with various embodiments.

With reference to FIG. 10, a suitable environment 1000 for implementing various aspects of the claimed subject matter includes a computer 1002. The computer 1002 includes a processing unit 1004, a system memory 1006, a codec 1035, and a system bus 1008. The system bus 1008 couples system components including, but not limited to, the system memory 1006 to the processing unit 1004. The processing unit 1004 can be any of various available processors. Dual microprocessors and other multiprocessor architectures also can be employed as the processing unit 1004.

The system bus 1008 can be any of several types of bus structure(s) including the memory bus or memory controller, a peripheral bus or external bus, or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCM-CIA), Firewire (IEEE 1394), and Small Computer Systems Interface (SCSI).

The system memory 1006 includes volatile memory 1010 and non-volatile memory 1012, which can employ one or more of the disclosed memory architectures, in various embodiments. The basic input/output system (BIOS), containing the basic routines to transfer information between elements within the computer 1002, such as during start-up, is stored in non-volatile memory 1012. In addition, according to present innovations, codec 1035 may include at least one of an encoder or decoder, wherein the at least one of an encoder or decoder may consist of hardware, software, or a combination of hardware and software. Although, codec 1035 is depicted as a separate component, codec 1035 may be contained within non-volatile memory 1012. By way of illustration, and not limitation, non-volatile memory 1012 can include read only memory (ROM), programmable ROM (PROM), electrically programmable ROM (EPROM), electrically erasable programmable ROM (EEPROM), or Flash memory. Non-volatile memory 1012 can employ one or more of the disclosed memory devices, in at least some embodiments. Moreover, non-volatile memory 1012 can be computer memory (e.g., physically integrated with computer 1002 or a mainboard thereof), or removable memory. Examples of suitable removable memory with which disclosed embodiments can be implemented can include a secure digital (SD) card, a compact Flash (CF) card, a universal serial bus (USB) memory stick, or the like. Volatile memory 1010 includes cache memory, or random access memory (RAM), which acts as external cache memory, and can also employ one or more disclosed memory devices in various embodiments. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM), and so forth.

Computer 1002 may also include removable/non-removable, volatile/non-volatile computer storage medium. FIG. 10 illustrates, for example, disk storage 1014. Disk storage 1014 includes, but is not limited to, devices like a magnetic disk drive, solid state disk (SSD) floppy disk drive, tape drive, Jaz drive, Zip drive, LS-100 drive, flash memory card, or memory stick. In addition, disk storage 1014 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1014 to the system bus 1008, a removable or non-removable interface is typically used, such as interface 1016. It is appreciated that storage devices 1014 can store information related to a user. Such information might be stored at or provided to a server or to an application running on a user device. In one embodiment, the user can be notified (e.g., by way of output device(s) 1036) of the types of information that are stored to disk storage 1014 or transmitted to the server or application. The user can be provided the opportunity to opt-in or opt-out of having such information collected or shared with the server or application (e.g., by way of input from input device(s) 1028).

It is to be appreciated that FIG. 10 describes software that acts as an intermediary between users and the basic computer resources described in the suitable operating environment 1000. Such software includes an operating system 1018. Operating system 1018, which can be stored on disk storage 1014, acts to control and allocate resources of the computer system 1002. Applications 1020 take advantage of the management of resources by operating system 1018 through program modules 1024, and program data 1026, such as the boot/shutdown transaction table and the like, stored either in system memory 1006 or on disk storage 1014. It is to be appreciated that the claimed subject matter can be implemented with various operating systems or combinations of operating systems.

A user enters commands or information into the computer 1002 through input device(s) 1028. Input devices 1028 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1004 through the system bus 1008 via interface port(s) 1030. Interface port(s) 1030 include, for example, a serial port, a parallel port, a game port, and a universal serial bus (USB). Output device(s) 1036 use some of the same type of ports as input device(s) 1028. Thus, for example, a USB port may be used to provide input to computer 1002 and to output information from computer 1002 to an output device 1036. Output adapter 1034 is provided to illustrate that there are some output devices 1036 like monitors, speakers, and printers, among other output devices 1036, which require special adapters. The output adapters 1034 include, by way of illustration and not limitation, video and sound cards that provide a means of connection between the output device 1036 and the system bus 1008. It should be noted that other devices or systems of devices provide both input and output capabilities such as remote computer(s) 1038.

Computer 1002 can operate in a networked environment using logical connections to one or more remote computers, such as remote computer(s) 1038. The remote computer(s) 1038 can be a personal computer, a server, a router, a network PC, a workstation, a microprocessor based appliance, a peer device, a smart phone, a tablet, or other network node, and typically includes many of the elements described relative to computer 1002. For purposes of brevity, only a memory storage device 1040 is illustrated with remote computer(s) 1038. Remote computer(s) 1038 is logically connected to computer 1002 through a network interface 1042 and then connected via communication connection(s) 1044. Network interface 1042 encompasses wire or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1044 refers to the hardware/software employed to connect the network interface 1042 to the bus 1008. While communication connection 1044 is shown for illustrative clarity inside computer 1002, it can also be external to computer 1002. The hardware/software necessary for connection to the network interface 1042 includes, for exemplary purposes only, internal and external technologies such as, modems including regular telephone grade modems, cable modems and DSL modems, ISDN adapters, and wired and wireless Ethernet cards, hubs, and routers.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject innovation(s). Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical or magnetic signals capable of being stored, transferred, combined, compared, or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts or events of the various processes.

What is claimed is:

1. A memory device, comprising:
    an array of memory cells, each respective memory cell of the array comprising a transistor and a resistive switching device;
    a set of bitlines comprising a bitline that is connected to first terminals of a first subset of the memory cells of the array;
    a set of wordlines comprising a wordline that is connected to transistor gate terminals of a second subset of the memory cells of the array;
    a source line connected to second terminals of the second subset of the memory cells of the array; and
    a dissipation line situated between two bitlines of the set of bitlines, wherein the dissipation line interconnects a variable voltage source, or ground, to a first terminal of a switching component, and the source line is connected to a second terminal of the switching component, wherein the switching component, when in a conductive state, provides the source line with a low resistance path to the variable voltage source, or the ground.

2. The memory device of claim 1, wherein at least one memory cell of the array of memory cells comprises the transistor coupled electrically in series with the resistive switching device.

3. The memory device of claim 2, wherein a gate terminal of the switching component is connected to the wordline.

4. The memory device of claim 3, wherein the switching component is controlled by the wordline to selectively conduct or resist current between the source line and the variable voltage source, or ground, connected to the dissipation line.

5. The memory device of claim 1, wherein the dissipation line and the first terminal of the switching component are directly interconnected.

6. The memory device of claim 1, wherein the dissipation line, when connected to the ground and with the switching component in a conductive state, reduces voltage dropped by the source line.

7. The memory device of claim 1, wherein the dissipation line and the source line are driven at a common voltage for a memory operation selected from a group consisting of: a read operation, a program operation or an erase operation.

8. The memory device of claim 1, wherein the switching component is a gate-controlled transistor, a diode, a multi-gate transistor or a solid-state switching device.

9. The memory device of claim 1, wherein the resistive switching device is a two-terminal multi-state filament device.

10. The memory device of claim 1, further comprising a multiplexing circuit connected to the set of bitlines, and configured to selectively activate a first subset of the set of bitlines or selectively deactivate a second subset of the set of bitlines.

11. The memory device of claim 10, wherein the dissipation line and the switching component are not connected to the multiplexing circuit.

12. The memory device of claim 10, wherein the variable voltage source, or ground, is within an integrated circuit chip on which the array of memory cells is formed.

13. The memory device of claim 1, further comprising:
    a second dissipation line, situated between two additional bitlines of the set of bitlines, different from the two bitlines of the set of bitlines; and
    a second switching component having at least a first terminal and a second terminal; wherein the second dissipation line provides a second low resistance path to ground for the source line in response to activation of the second switching component.

14. The memory device of claim 1, further comprising:
    a second switching component having a first terminal and a second terminal, the first terminal being connected to the dissipation line; and
    a second source line connected to the second terminal of the second switching component, and to second terminals of a third subset of the memory cells of the array, wherein the second switching component, when activated, provides a low resistance path between the second source line and the dissipation line.

15. The memory device of claim 1, further comprising a set of dissipation lines including the dissipation line, respective ones of the set of dissipation lines are interspersed between respective subsets of the set of bitlines and are configured to cap the voltage drop along the source line, wherein a maximum voltage drop is related to a ratio of a number of bitlines and a number of dissipation lines.

16. A method of fabricating a memory device, comprising:
forming a bitline in or on a substrate;
forming a wordline in or on the substrate;
forming a dissipation line in or on the substrate;
forming a source line in or on the substrate;
forming an array of memory cells having respective first memory terminals and respective second memory terminals, respective memory cells of the array comprising a transistor in series with a resistive memory component;
connecting respective first memory terminals of a first subset of the array of memory cells to the bitline;
connecting respective second memory terminals of a second subset of the array of memory cells to the source line; and
forming a switch interconnecting the source line and the dissipation line, the switch configured to provide a low resistance path between the source line and the dissipation line in response to activation of the switch.

17. The method of claim 16, further comprising connecting the wordline to a control terminal of the switch, and to respective gate terminals of transistors of the second subset of the array.

18. The method of claim 16, further comprising forming a source line driver in or on the substrate configured to drive a voltage on the source line, or to ground the source line.

19. The method of claim 16, further comprising forming a dissipation line driver in or on the substrate configured to drive a voltage on the dissipation line, or to ground the dissipation line.

20. The method of claim 16, further comprising:
forming a multiplexing circuit having a set of voltage outputs, the multiplexing circuit configured to provide a first voltage to a selected first subset of the set of voltage outputs and provide a second voltage, or ground, to a selected second subset of the set of voltage outputs;
forming a set of bitlines including the bitline;
connecting respective bitlines of the set of bitlines to respective voltage outputs of the set of voltage outputs of the multiplexing circuit; and
terminating the dissipation line at the switch and isolating the dissipation line from the multiplexing circuit.

* * * * *